United States Patent
Shiraishi et al.

(10) Patent No.: US 9,052,341 B2
(45) Date of Patent: Jun. 9, 2015

(54) PROBE CARD AND MANUFACTURING METHOD THEREOF

(75) Inventors: Akinori Shiraishi, Nagano (JP);
Hideaki Sakaguchi, Nagano (JP);
Mitsutoshi Higashi, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 500 days.

(21) Appl. No.: 13/403,227

(22) Filed: Feb. 23, 2012

(65) Prior Publication Data

US 2012/0229157 A1  Sep. 13, 2012

(30) Foreign Application Priority Data

Mar. 9, 2011  (JP) .................................. 2011-051430
Jan. 25, 2012  (JP) .................................. 2012-013247

(51) Int. Cl.
*G01R 3/00* (2006.01)
*G01R 1/073* (2006.01)
*G01R 31/28* (2006.01)

(52) U.S. Cl.
CPC ............. *G01R 3/00* (2013.01); *Y10T 29/49117* (2015.01); *G01R 1/07378* (2013.01); *G01R 31/2889* (2013.01)

(58) Field of Classification Search
CPC ... G01R 1/06716; G01R 1/0735; G01R 1/049
See application file for complete search history.

(56) References Cited

U.S. PATENT DOCUMENTS

| | | | | |
|---|---|---|---|---|
| 6,114,864 | A * | 9/2000 | Soejima et al. | 324/756.03 |
| 8,445,295 | B2 * | 5/2013 | Shibuya et al. | 438/14 |
| 2005/0140382 | A1 * | 6/2005 | Wilson et al. | 324/754 |
| 2006/0091558 | A1 * | 5/2006 | Huang et al. | 257/774 |

FOREIGN PATENT DOCUMENTS

JP   2001-52779   2/2001

* cited by examiner

*Primary Examiner* — Tung X Nguyen
*Assistant Examiner* — Feba Pothen
(74) *Attorney, Agent, or Firm* — Drinker Biddle & Reath LLP

(57) ABSTRACT

In one embodiment, a probe card is provided. The probe card includes: a substrate having a first surface and a second surface opposite to the first surface; a through hole formed through the substrate and extending between the first surface and the second surface; an elastic member formed in the through hole to extend to the first surface; a through electrode formed in through hole to extend to the second surface; a first trace on a surface of the elastic member to be electrically connected to the through electrode; and a contact bump on the elastic member via the first trace to be electrically connected to the first trace, wherein the contact bump is electrically connected to an electrode pad formed on a DUT (device under test) when an electrical testing is performed on the DUT using the probe card.

10 Claims, 6 Drawing Sheets

PROBE CARD AND MANUFACTURING METHOD THEREOF

This application claims priority from Japanese Patent Applications No. 2011-051430, filed on Mar. 9, 2011, and No. 2012-013247, filed on Jan. 25, 2012, the entire contents of which are herein incorporated by reference.

BACKGROUND

1. Technical Field

Embodiments described herein relate to a probe card and a manufacturing method of the probe card.

2. Related Art

Related-art manufacturing methods of semiconductor devices include a test step of testing electrical characteristics of semiconductor chips. Semiconductor testers used for such a test step are equipped with probe needles to be electrically connected to electrode pads formed on each of semiconductor chips on a wafer. For example, a semiconductor tester supplies electrical signals to circuits formed on each semiconductor chip via the probe needles and receives signals that are output from the circuits via the probe needles. The semiconductor tester tests operation of the circuits based on the received signals and judges whether the semiconductor chip is defective or not.

In recent years, the density of devices incorporated in a semiconductor chip and the number of signals processed therein have been increased and, accordingly, the number of electrode pads formed in a semiconductor chip (i.e., the number of pins) has been increased and the pitch of the electrode pads has been reduced. This makes it difficult to bring the probe needles into contact with the individual electrode pads with high accuracy. In view of this, various proposals have been made in which a plurality of connection terminals are formed on a substrate and connections are made to a plurality of electrode pads together using those connection terminals.

For example, a contact probe disclosed in JP-A-2001-52779 has contact projections that are integral with a probe body. The probe body and the contact projections are formed by resin molding using an anisotropic conductive resin.

Incidentally, the surface of a semiconductor chip is formed with a passivation film and electrode pads are exposed through openings of the passivation film. On the other hand, the contact projections disclosed in JP-A-2001-52779 are formed by resin molding so as to be shaped like a quadrangular pyramid or a hemisphere. Therefore, depending on the ratio (aspect ratio) between the size of the electrode pads that are exposed through the openings of the passivation film (i.e., the dimension of the openings) and the thickness of the passivation film, there may occur a case that the contact projections cannot come into contact with the electrode pads.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

It is one of illustrative aspects of the present invention to provide a probe card whose contact projections can reliably be brought into contact with a plurality of electrode pads formed on semiconductor chips, as well as its manufacturing method.

According to one or more illustrative aspects of the present invention, there is provided a probe card. The probe card includes: a substrate having a first surface and a second surface opposite to the first surface; a through hole formed through the substrate and extending between the first surface and the second surface; an elastic member formed in the through hole to extend to the first surface and having a first surface and a second surface opposite to the first surface, wherein the first surface of the elastic member is located on a side of the first surface of the substrate, and the second surface of the elastic member is located on an inside of the through hole; a through electrode formed in the through hole to extend to the second surface of the substrate; a trace formed to extend from the second surface of the elastic member to the first surface of the elastic member, wherein the trace is electrically connected to the through electrode on the second surface of the elastic member; and a contact bump on the elastic member via the trace to be electrically connected to the trace, wherein the contact bump is electrically connected to an electrode pad formed on a DUT (device under test) when an electrical testing is performed on the DUT using the probe card.

According to one or more illustrative aspects of the present invention, there is provided a method of manufacturing a probe card. The method includes: (a) providing a substrate having a first surface and a second surface opposite to the first surface; (b) forming a deep hole in the substrate from the first surface of the substrate, wherein the deep hole comprises: a first hole extending to the first substrate; and a second hole communicating with the first hole; (c) forming a though electrode in the second hole; (d) forming a first trace such that one end of the first trace is connected to the through electrode and the other end of the first trace is formed on the first surface of the substrate; (e) forming an elastic member in the first hole; (f) grinding the substrate from the second surface of the substrate such that the deep hole extends to the second surface; (g) forming a second trace on the first surface of the substrate such that one end of the second trace is connected to the first trace and the other end of the second trace is formed on the elastic member; and (h) forming a contact bump on the elastic member via the second trace.

Other aspects and advantages of the present invention will be apparent from the following description, the drawings and the claims.

DETAILED DESCRIPTION OF EXEMPLARY EMBODIMENTS

Figure 1:
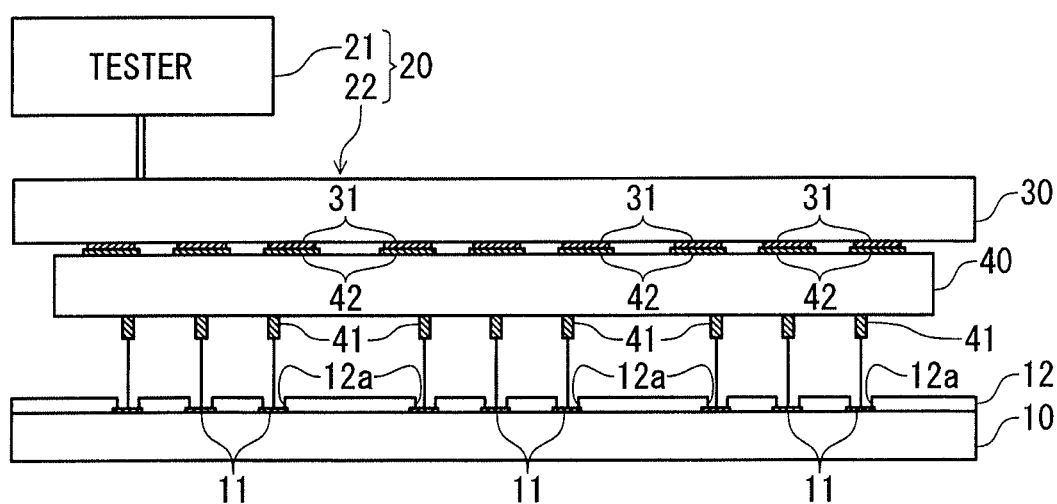
FIG. 1 outlines the configuration of a semiconductor tester.

Hereinafter, exemplary embodiments of the present invention will be described with reference to the accompanying drawings. In all the drawings for the explanation of the embodiments, the members having the same functions are represented by the same reference numerals, and repeated description thereof will be omitted. The accompanying drawings are for outlining of structures and do not conform to actual dimensions.

As illustrated in FIG. 1, a semiconductor tester 20 for testing a DUT (device under test) 10 is equipped with a tester 21 and a probe device 22 which is connected to the tester 21.

The DUT 10 is, for example, a single semiconductor wafer on which a plurality of semiconductor chips are formed (not cut out yet). The DUT 10 has a plurality of electrode pads 11 to be connected to devices of the semiconductor chips. The DUT 10 is formed with a passivation film 12 and the electrode pads 11 are exposed through openings 12a of the passivation film 12.

The probe device 22 includes a wiring board 30 and a probe card 40. The wiring board 30 has a plurality of connection bumps 31 which are formed on a major surface that faces the probe card 40. The connection bumps 31 are made of a gold-tin solder, for example. The wiring board 30 is formed with traces (not illustrated) which connect the connection bumps 31 to the tester 21.

The probe card 40 has a plurality of contact bumps 41 which are formed on a major surface to face the DUT 10. The contact bumps 41 may be made of nickel, copper, a nickel alloy, or the like. The contact bumps 41 are located to face the respective electrode pads 11 of the DUT 10. The probe card 40 has a plurality of traces 42 which are formed on the major surface that faces the wiring board 30. The traces 42 are made of copper, nickel, a nickel alloy, or the like. The traces 42 are located to face the respective connection bumps 31 of the wiring board 30. The traces 42 are connected to the respective connection bumps 31. The contact bumps 41 are connected to the respective traces 42.

[Configuration of Probe Card]

Figure 2:
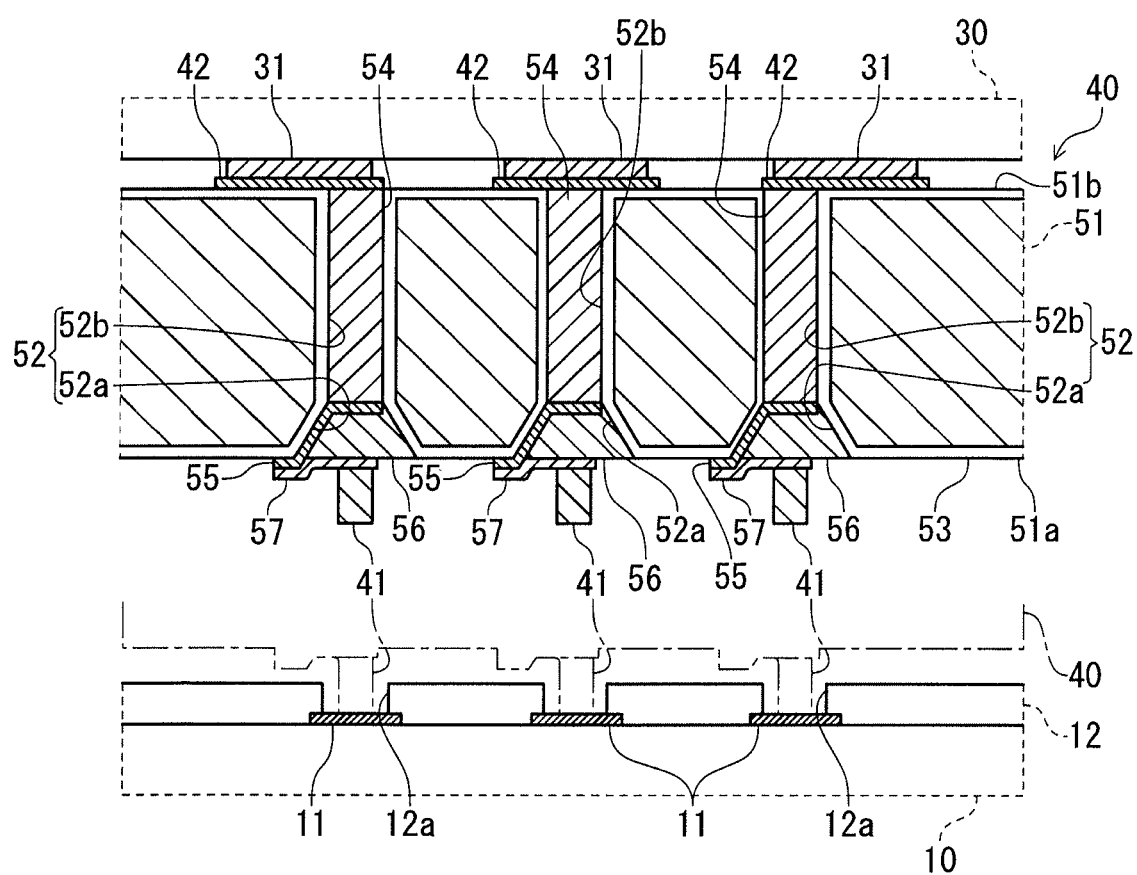
FIG. 2 is a sectional view of part of a probe card.

As illustrated in FIG. 2, the probe card 40 has a substrate 51. The substrate 51 is made of the same material (in the embodiment, silicon) as the substrate of the DUT 10. Other examples of the material of the substrate 51 are ceramics, glass, a resin (e.g., insulative resin), and a metal (e.g., copper).

A plurality of through-holes 52 are formed through the substrate 51 between a first major surface 51a (lower surface in FIG. 2) facing the DUT 10 and a second major surface 51b (top surface in FIG. 2) which is opposite to the first major surface 51a and faces the wiring board 30. The through-holes 52 are formed at such positions as to correspond to the respective electrode pads 11 of the DUT 10.

Each through-hole 52 is composed of a first hole portion 52a and a second hole portion 52b. The first hole portion 52a has a prescribed depth as measured from the first major surface 51a. The opening portion of the first hole portion 52a is wider than its deep end portion and the first hole portion 52a is thus increased in diameter toward the opening portion. The second hole portion 52b extends from the deep end portion of the first hole portion 52a to the second major surface 51b, and is generally cylindrical.

Insulating films 53, which are silicon oxide films, for example, are formed on the surfaces of the substrate 51 including the inner surfaces of the through-holes 52.

A through electrode 54 is formed in the second hole portion 52b of each through-hole 52 so as to extend from the opening portion (formed in the second major surface 51b) of the second hole portion 52b to the deep end portion of the first hole portion 52a. The through electrode 54 is made of copper or nickel, for example. The through electrode 54 is insulated from the substrate 51 by the insulating film 53. In the sectional view of FIG. 2, the insulating films 53 are not hatched to make the substrate 51, the through electrode 54, etc. more recognizable.

The through electrode 54 is connected to an associated first trace 55. The first trace 55 extends from the deep end portion of the first hole portion 52a (i.e., the end of the through electrode 54) to its opening portion across the inner surface of the first hole portion 52a along a prescribed direction. That is, one end portion of the first trace 55 is electrically connected to the through electrode 54 and the other end portion of the first trace 55 is formed on the first major surface 51a of the substrate 51. The first trace 55 is made of copper, gold, nickel, a nickel alloy, platinum, or the like.

Each first hole portion 52a is filled with an elastic member 56 which is made of an elastic resin such as a silicone resin. A second trace 57 is formed on the lower surface (first surface) (as viewed in FIG. 2) of the elastic member 56, which is located on a side of the first major surface 51a of the substrate 51. A second surface of the elastic member 56 opposite to the first surface faces the through-hole 52, and one end portion of the first trace 55 is formed on the second surface of the elastic member 56. One end portion of the second trace 57 is electrically connected to the other end portion of the first trace 55. The other end portion of the second trace 57 is formed approximately at the center of the first surface of the elastic member 56 so as to have a prescribed shape (e.g., disc shape). Like the first trace 55, the second trace 57 may be made of copper, gold, nickel, a nickel alloy, platinum, or the like.

A contact bump 41 is formed on the lower surface (as viewed in FIG. 2) of the other end portion of each second trace 57 so as to face the associated electrode pad 11 of the DUT 10. For example, the contact bump 41 extends from the lower surface of the other end portion of the second trace 57 and has a cylindrical shape. The contact bump 41 is made of copper, gold, nickel, a nickel alloy, rhodium, or the like. It is preferable that the contact bump 41 be formed so as to share the same axis with the associated through electrode 54 and extend along the axis. The contact bump 41 is formed on the other end portion of the second trace 57.

The contact bump 41 is shaped so as to be suitable for the thickness of the exposed portion of the associated electrode pad 11 and the thickness of the passivation film 12. For example, where the passivation film 12 is 10 μm in thickness, the diameter and the vertical length of the contact bump 41 are set at 15 μm and 20 μm, respectively.

The above-configured probe device 22 is supported so as to be parallel with the DUT 10 which is fixed to a test stage (not illustrated). The probe device 22 and the DUT 10 are positioned face each other so that the contact bumps 41 of the probe card 40 face the respective electrode pads 11 of the DUT 10, and the tips of the contact bumps 41 are brought into contact with the respective electrode pads 11 (indicated by chain lines in FIG. 2).

The contact bumps 41 are formed according to the shape of the DUT 10, more specifically, the thickness of the passivation film 12 and the shape of its openings for exposing the electrode pads 11. When the passivation film 12 is made thicker, the vertical length, and hence the aspect ratio, of the contact bumps 41 can be changed accordingly. As a result, the contact bumps 41 can reliably be brought into contact with the respective electrode pads 11. Since the shape of the contact bumps 41 can be set according to the shape of the passivation film 12, the probe device 22 can easily accommodate a shape change of the DUT 10.

The elastic members 56 are disposed right over the respective contact bumps 41. Since the elastic members 56 are elastic, the contact bumps 41 can be displaced in the vertical direction. Therefore, even if the contact bumps 41 have a variation in length, the contact bumps 41 can be brought into contact with the respective electrode pads 11 because the contact bumps 41 go into the first hole portions 52a which are filled with the elastic members 56 and the length variation of the contact bumps 41 is thereby absorbed by the elastic members 56.

Even if the probe device 22 and the DUT 10 are inclined with respect to each other, the contact bumps 41 can likewise be brought into contact with the respective electrode pads 11. That is, when the probe device 22 is supported in an inclined manner, contact bumps 41 that first come into contact with associated electrode pads 11 go into the first hole portions 52a which are filled with the elastic members 56, which allows the other contact bumps 41 to come into contact with the associated electrode pads 11.

When, for example, the probe device 22 is lowered toward the DUT 10, the contact bumps 41 are pressed against the respective electrode pads 11 by elastic forces that are exerted from the elastic members 56, whereby the contact bumps 41 and the electrode pads 11 can be electrically connected to each other in a reliable manner.

In the probe card 40, an associated contact bump 41, elastic member 56, and through electrode 54 are disposed along the vertical axis that is perpendicular to the first major surface 51a and the second major surface 51b of the substrate 51. And the through electrode 54 cannot be moved in the second hole portion 52b of the through-hole 52. Therefore, as the contact bump 41 goes into the first hole portion 52a, the elastic member 56 is compressed and hence the contact bump 41 is pressed against the associated electrode pad 11. Thus, the contact bump 41 and the electrode pad 11 can be connected to each other reliably.

As described above, the contact bumps 41 can be electrically connected to the respective electrode pads 11 of the a plurality of semiconductor chips of the DUT 10. Therefore, the a plurality of semiconductor chips can be tested parallel and, as a result, the testing time of the DUT 10 can be made shorter than in a case that the semiconductor chips are tested individually and sequentially.

Since the substrate 51 is made of the same material (silicon) as the DUT 10, the difference between the thermal expansion coefficients of the probe card 40 and the DUT 10 can be made small, as a result of which the contact bumps 41 can be brought into contact with the respective electrode pads 11 of the semiconductor chips with high accuracy. When the temperature of the DUT 10 is varied by a test, the substrate 51 expands or contracts according to the temperature variation, whereby relative positional deviations between the contact bumps 41 and the electrode pads 11 can be reduced.

Next, a manufacturing process of the probe card 40 will be described with an assumption that the substrate 51 is made of silicon.

Figure 3A:
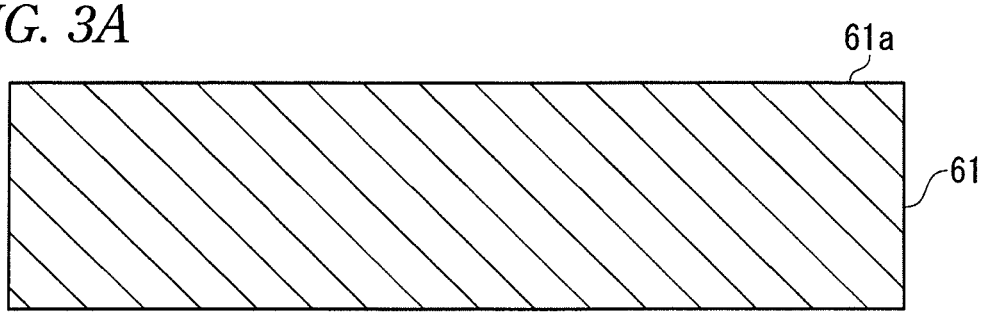
FIGS. 3A-3E are schematic sectional views illustrating part of a manufacturing process of the probe card.

First, a substrate 61 which is a silicon wafer is prepared as illustrated in FIG. 3A. The thickness of the substrate 61 is about 725 to 775 μm, for example.

Figure 3B:
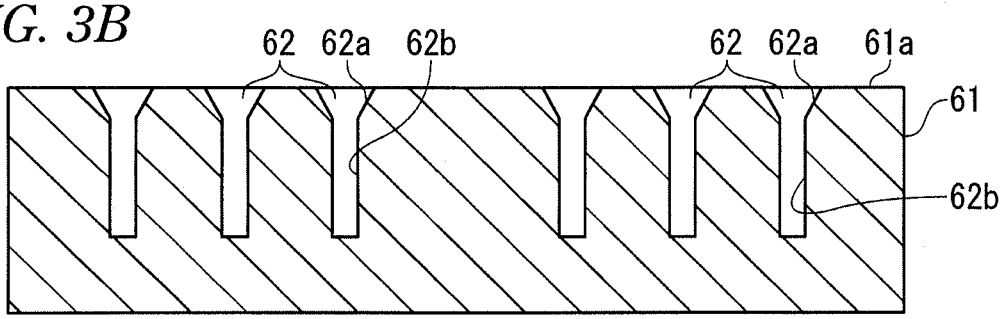

Then, as illustrated in FIG. 3B, deep holes 62 are formed in the substrate 61 by etching it by high-aspect-ratio etching through openings of a mask (not illustrated) formed on the major surface 61a of the substrate 61. For example, a Bosch process is used for the high-aspect-ratio etching.

The Bosch process is an etching technique for forming a deep hole in a silicon substrate and, more specifically, is an etching technique in which etching (etching step) and side wall protection (protection step) are performed repeatedly. In the etching step, isotropic etching is performed using sulfur hexafluoride ($SF_6$). In the protection step, a side wall is protected (i.e., lateral etching is suppressed) using a Teflon (registered trademark)-type gas (e.g., $C_4F_8$). Since the etching step and the protection step are performed repeatedly, the side surface of each deep hole 62 formed by the Bosch process has a scallop shape (a repetition of a fine projection and recess). A first hole portion 62a whose diameter increases toward the surface 61a and a second hole portion 62b which extends perpendicularly to the major surfaces of the substrate 61 are formed by adjusting the ratio between gases used in the etching step and the protection step and other factors.

The deep holes 62 may be formed by other methods such as deep RIE (reactive ion etching) and a combination of anisotropic etching (e.g., dry etching) and isotropic etching (e.g., wet etching). The first hole portions 62a may be formed by crystal anisotropic etching in which potassium hydroxide (KOH) and tetramethyl ammonium hydroxide (TMAH) are used as etching liquids and an etching rate for the (111) surface of a semiconductor crystal is utilized.

Figure 3C:
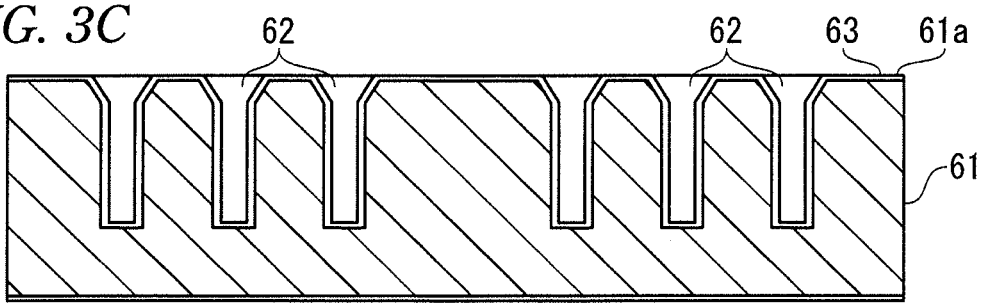

Then, as illustrated in FIG. 3C, insulating films 63 are formed on the entire surfaces of the substrate 61 and the inner surfaces of the deep holes 62. For example, the insulating films 63 are silicon oxide films formed by thermal oxidation. The insulating films 63 may be formed by other methods such as CVD (chemical vapor deposition).

Figure 3D:
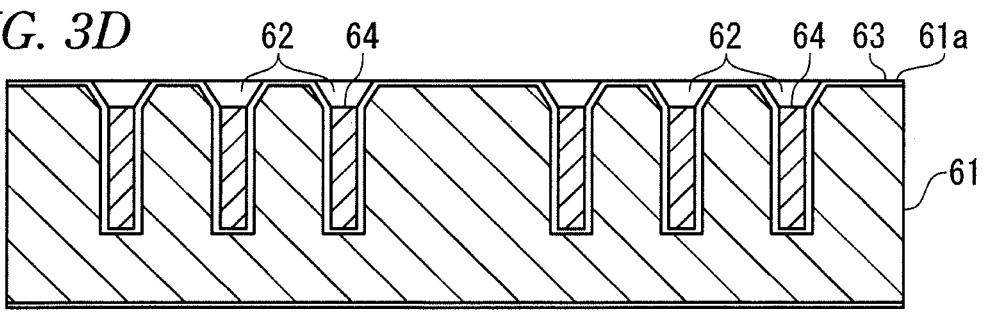

Then, as illustrated in FIG. 3D, electrodes 64 are formed in the respective second hole portions 62b by such methods as electrolytic plating, electroless plating, and charging of a conductive paste. In the case of electrolytic plating, electrodes 64 are formed using seed layers that are formed by MOCVD (metal organic chemical vapor deposition) or the like.

Figure 3E:
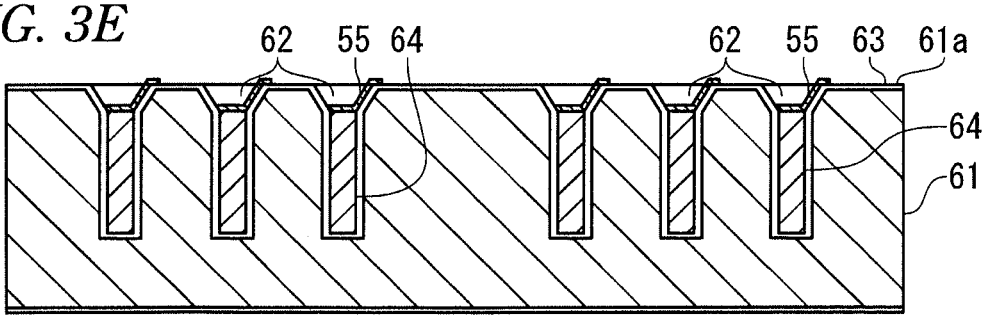

Then, as illustrated in FIG. 3E, first traces 55 are formed by a semiadditive method, an additive method, or the like. The first traces 55 are formed by PVD (physical vapor deposition), plating, or the like using a mask (not illustrated) having openings. The one end portion of the first trace 55 is electrically connected to the electrode 64, and the other end portion of the first trace 55 is formed on the major surface 61a of the substrate 61. Specifically, one end portion of the first trace 55 is formed to extend along a rim of the first hole portion 62a from one end portion toward the other end portion.

Figure 4A:
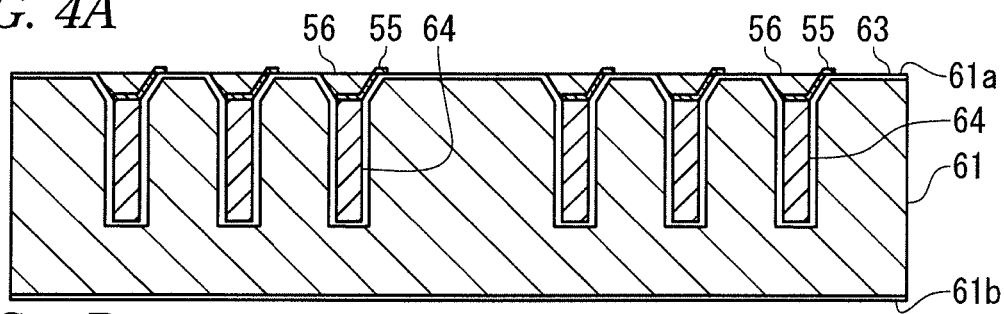
FIGS. 4A-4E are schematic sectional views illustrating the other part of the manufacturing process of the probe card.

Then, as illustrated in FIG. 4A, elastic members 56 are formed in the respective first hole portions 62a by silicone resin vacuum printing, for example.

Figure 4B:
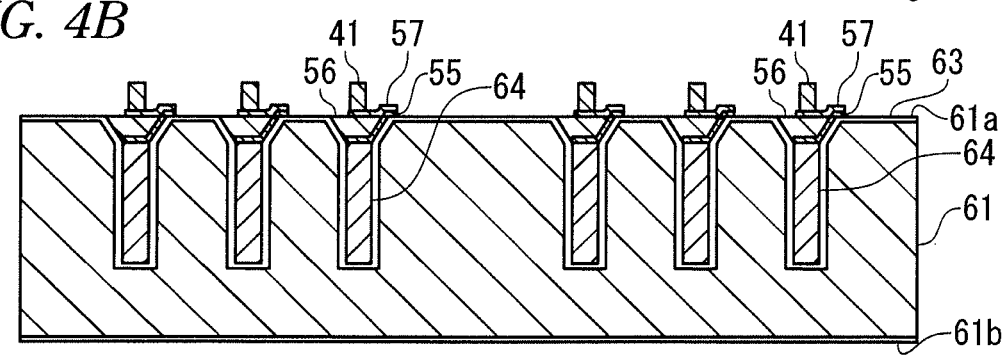

Then, as illustrated in FIG. 4B, second traces 57 are formed by a semiadditive method, an additive method, or the like. The second traces 57 are formed by PVD, plating, or the like using a mask (not illustrated) having openings. Then, contact bumps 41 are formed on the respective second traces 57 by plating, for example. Through these processes illustrated in FIGS. 4A and 4B, the one end portion of the second trace 57 is electrically connected to the other end portion of the first trace 55. The other end portion of the second trace 57 is formed on the elastic member 56, and the contact bump 41 is formed on the other end portion of the trace 57.

Figure 4C:
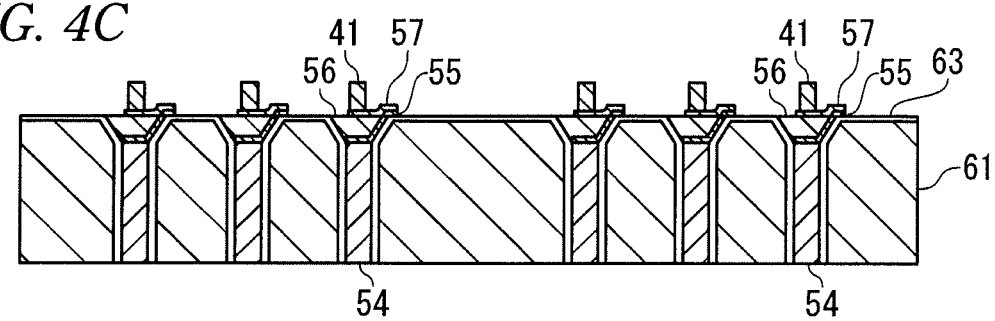

Then, as illustrated in FIG. 4C, the substrate 61 is thinned to change the deep holes 62 to through-holes 52 by grinding the substrate 61 from the side of a second major surface 61b. As a result of execution of the grinding step, the thickness of the substrate 61 is reduced to 200 μm, for example. To this end, in the step of FIG. 3B, the deep holes 62 are formed so that their depth is greater than the thickness of the thinned substrate 61.

Figure 4D:
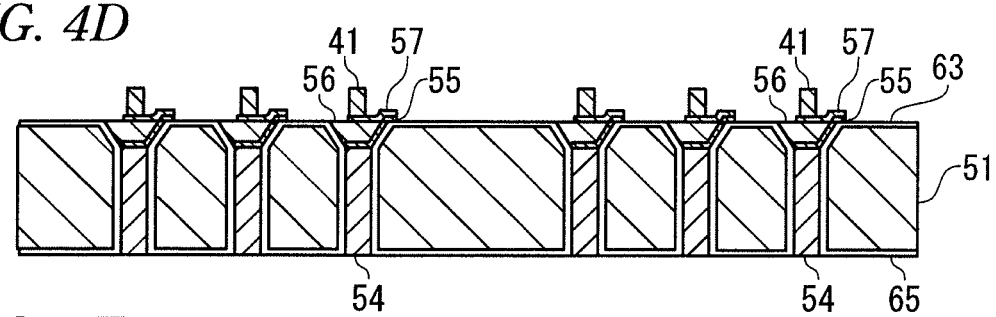

Then, as illustrated in FIG. 4D, an insulating film 65 which is a silicon oxide film is formed on the lower surface (ground surface) of the substrate 61 by low-temperature CVD, for example. The insulating film 65 and the insulating films 63 which were formed at the step of FIG. 3C constitute the insulating films 53 illustrated in FIG. 2. With the above procedure, the substrate 51 having the through-holes 52 is formed in which the elastic members 56 occupy the respective first hole portions 52a of the through-holes 52 and the through electrodes 54 are fixedly disposed in the respective second hole portions 52b (see FIG. 2).

Figure 4E:
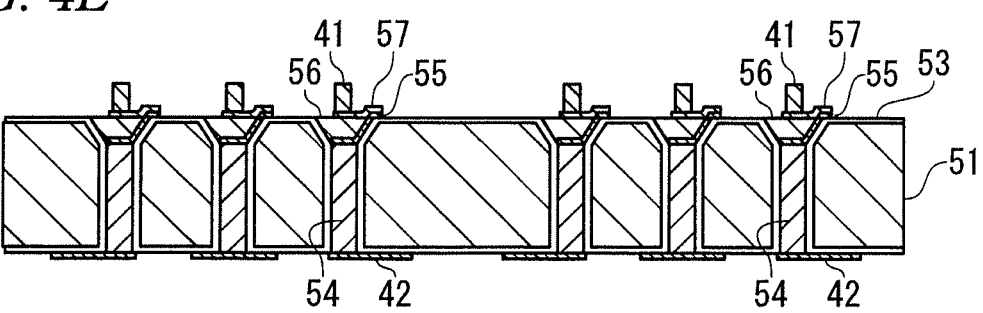

Finally, as illustrated in FIG. 4E, traces 42 are formed on the second major surface 51b of the substrate 51 by a semi-additive method, an additive method, or the like. The traces 42 are formed by PVD, plating, or the like using a mask (not illustrated) having openings. Thus, the traces 42 are formed on the second major surface 51b of the substrate 51 so as to be electrically connected to the electrode 54.

As described above, the embodiment provides the following advantages:

(1) The through-holes 52 are formed through the substrate 51 of the probe card 40 between the first major surface 51a and the second major surface 51b. Each through-hole 52 is composed of the first hole portion 52a and the second hole portion 52b. The elastic member 56 is formed in the first hole portion 52a and the through electrode 54 is formed in the second hole portion 52b. The second trace 57 which is connected to the through electrode 54 by the first trace 55 is formed on the lower surface of the elastic member 56. The other end portion of the second trace 57 is located on the lower surface of the elastic member 56. The contact bump 41 to be electrically connected to the associated electrode pad 11 of the DUT 10 so as to face the electrode pad 11. The contact bump 41 having a cylindrical shape is formed according to the shape of the DUT 10, more specifically, the thickness of the passivation film 12 and the shape of the opening for exposing the electrode pad 11. Therefore, when the passivation film 12 is made thicker, the vertical length (i.e., height), and hence the aspect ratio, of the contact bumps 41 can be changed accordingly. As a result, the contact bumps 41 can reliably be brought into contact with the respective electrode pads 11. Since the shape of the contact bumps 41 can be set according to the shape of the passivation film 12, the probe device 22 can easily accommodate a shape change of the DUT 10.

(2) The elastic members 56 are disposed right over the respective contact bumps 41. Since the elastic members 56 are elastic, the contact bumps 41 can be displaced in the vertical direction. Therefore, even if the contact bumps 41 have a variation in length, the contact bumps 41 can be brought into contact with the respective electrode pads 11 because the contact bumps 41 go into the first hole portions 52a which are filled with the elastic members 56 and the length variation of the contact bumps 41 is thereby absorbed by the elastic members 56.

(3) Even if the probe device 22 and the DUT 10 are inclined with respect to each other, the contact bumps 41 can be brought into contact with the respective electrode pads 11. That is, when the probe device 22 is supported in an inclined manner, contact bumps 41 that first come into contact with associated electrode pads 11 go into the first hole portions 52a which are filled with the elastic members 56, which allows the other contact bumps 41 to come into contact with the associated electrode pads 11.

When, for example, the probe device 22 is lowered toward the DUT 10, the contact bumps 41 are pressed against the respective electrode pads 11 by elastic forces that are exerted from the elastic members 56, whereby the contact bumps 41 and the electrode pads 11 can be electrically connected to each other in a reliable manner.

The embodiment can be modified in the following manners:

Although in the embodiment each first hole portion 52a is formed in such a manner that its opening portion is wider than its deep end portion (see FIG. 2), the shape of the first hole portions 52a may be changed as appropriate as long as they enable formation of the first traces 55 which connect the through electrodes 54 to the second traces 57, respectively.

Figure 5A:
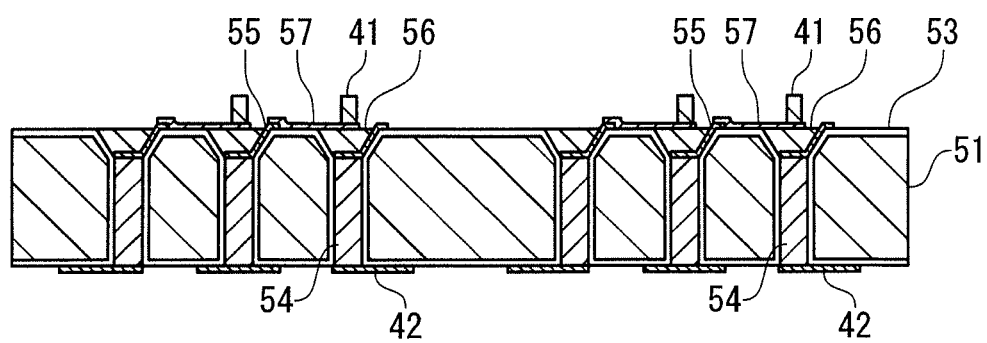
FIGS. 5A and 5B are sectional views of parts of modified probe cards.

As illustrated in FIG. 5A, first traces 55 and the second surfaces 57 may be formed so as to connect a contact bump 41 that is located right over each through-hole 52 is connected to the through electrode 54 of an adjacent through-hole 52. This structure makes it possible to dispose, at arbitrary positions, the contact bumps 41 and the traces 42 which are connected to the respective connection bumps 31 (see FIG. 2), that is, to increase the degree of freedom of their arrangement.

Figure 5B:
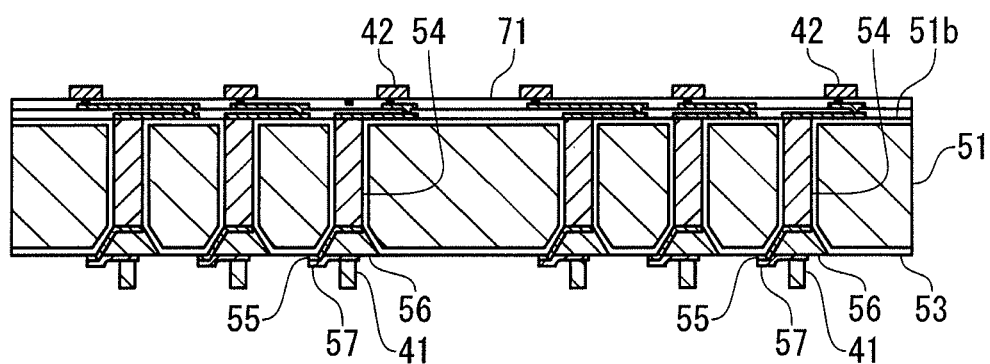

As illustrated in FIG. 5B, a multilayer wiring layer 71 may be formed on the second major surface 51b of the substrate 51. Alternatively, a multilayer wiring layer may be formed on the first major surface 51a. For example, the multilayer wiring layer 71 is formed by laying wiring layers and insulating layers alternately by a build-up method. The formation of the multilayer wiring layer 71 makes it possible to dispose, at arbitrary positions, the contact bumps 41 and the traces 42 which are connected to the respective connection bumps 31 (see FIG. 2), that is, to increase the degree of freedom of their arrangement.

Instead of the silicon oxide ($SiO_2$) films, silicon nitride (SiN) films may be formed as the insulating films 53. As a further alternative, a plurality of kinds of insulating films such as a silicon oxide film and a silicon nitride film may be laid on each other.

The manufacturing process according to the embodiment may be modified as appropriate. For example, the step of forming the second traces 57 and the contact bumps 41 (see FIG. 4B) may be executed after the step of forming the insulating films 65 (see FIG. 4D) or the thinning step (see FIG. 4C).

In the above embodiment, the shape of the elastic members 56 and the shape of the second traces 57 which are formed on the first surfaces of the elastic members 56 may be changed as appropriate.

Figure 6A:
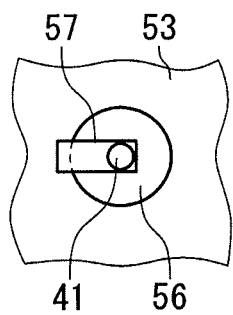
FIGS. 6A-6H are plan views illustrating various shapes of traces.

For example, as illustrated in FIG. 6A, each second trace 57 may be formed so as to have a rectangular shape in a plan view in such a manner that its one end portion (left end portion in FIG. 6A) is located on the insulating film 53 and its tip portion is located approximately at the center of the first surface of the associated elastic member 56. Where each second trace 57 is formed in this manner, at least part of the associated elastic member 56 is exposed (the same is true of a case that the tip portion has a circular arc shape). Therefore, when the contact bumps 41 are brought into pressure contact with the electrode pads 11 illustrated in FIGS. 1 and 2 and each elastic member 56 is deformed by a resulting movement of the associated contact bump 41, the exposed part of the elastic member 56 can escape. As a result, the load exerted on each second trace 57 can be reduced.

Figure 6B:
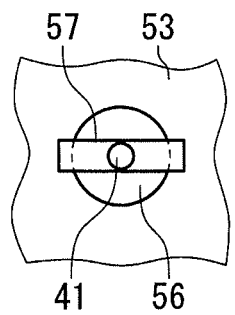
Figure 6C:
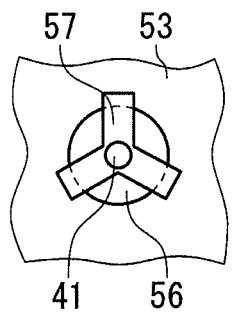
Figure 6D:
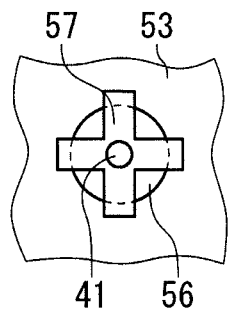

As illustrated in FIG. 6B, each second trace 57 may be formed in such a manner that it passes over the center of the first surface of the associated elastic member 56 and its both end portions are located on the insulating film 53. Three or more end portions may be located on the insulating film 53. For example, as illustrated in FIG. 6C, each second trace 57 may be formed so that it extends in three directions from the position right above the center of the associated elastic member 56 and its three end portions are located on the insulating film 53. As illustrated in FIG. 6D, each second trace 57 may be formed so that it extends in four directions from the position right above the center of the associated elastic member 56 and its four end portions are located on the insulating film 53. The second traces 57 having any of the above structures can prevent a fall of the contact bumps 41 when they are pressed against the electrode pads 11 illustrated in FIGS. 1 and 2.

Figure 6E:
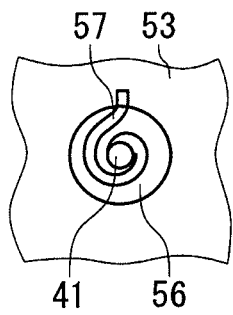

The shape of the second traces 57 is not limited to straightly extending shapes. For example, as illustrated in FIG. 6E, each second trace 57 may have a spiral shape. In this case, since the length of each second trace 57 from the proximal end to the tip is longer than in the case of straightly extending shapes, the stress acting on each second trace 57 when the associated contact bump 41 is moved (in the direction perpendicular to the paper surface of FIG. 6E) is made weaker and hence the load exerted on each second trace 57 can be reduced.

Figure 6F:
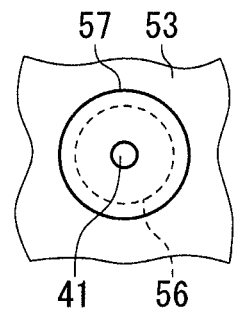

As illustrated in FIG. 6F, each second trace 57 may be formed so as to cover the entire surface of the associated elastic member 56. In this case, each second trace 57 can be made thinner than in the case of straightly extending shapes.

Figure 6G:
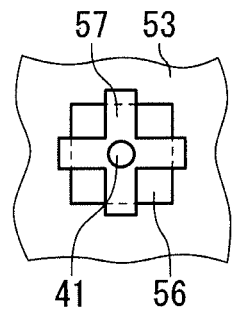
Figure 6H:
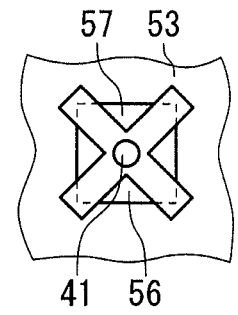

Furthermore, as illustrated in FIGS. 6G and 6H, each elastic member 56 may be formed so that its surface shape is rectangular (i.e., each first hole portion 52a illustrated in FIG. 2 is made rectangular). For the thus-formed elastic members 56, each second trace 57 may be formed so as to extend from the position right above the center of the surface of the associated elastic member 56 in two directions that are perpendicular to each other. In this case, as illustrated in FIG. 6G, each second trace 57 may extend in the directions each of which is perpendicular to the confronting sidelines of the surface of the associated rectangular elastic member 56. Alternatively, as illustrated in FIG. 6H, each second trace 57 may be formed so as to extend in the diagonal directions of the first surface of the associated rectangular elastic member 56. In addition, for the elastic members 56 having a rectangular surface, each second trace 57 may have any of the shapes illustrated in FIGS. 6A-6C, 6E, and 6F and like shapes.

Although the embodiment is directed to the probe card 40 for testing semiconductor chips on a wafer, the concept of the embodiment may be applied to a probe card for testing a separated individual semiconductor chip.

The DUT is not limited to a semiconductor wafer and may be another thing having a plurality of terminals, such as a semiconductor package.

A metal layer such as a gold layer may be formed on the tip surface of each contact bump 41. The gold layer is formed by plating, for example. Where the contact bumps 41 are made of copper, for example, the metal layer formed on the tip surface of each contact bump 41 is composed of, for example, a nickel layer and a gold layer or a nickel layer, a palladium layer, and a gold layer. It is preferable that the gold layer be the outermost layer of the metal layer. The formation of the metal layer makes it possible to reduce the contact resistance between the contact bumps 41 and the electrode pads 11.

The shape of the contact bumps 41 may be changed as appropriate according to the shape of the DUT 10. For example, the contact bumps 41 may have a hemispherical shape or a generally spherical shape when their aspect ratio is low. The connection bumps 31 may be provided on the side of the probe card 40.

While the present invention has been illustrated and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A probe card, comprising:
   a substrate having a first surface and a second surface opposite to the first surface;
   a through hole formed through the substrate and extending between the first surface and the second surface;
   an elastic member formed in the through hole to extend to the first surface of the substrate and having a first surface and a second surface opposite to the first surface, wherein the first surface of the elastic member is located and exposed on a side of the first surface of the substrate, and the second surface of the elastic member is located at an intermediate position, in a thickness direction of the substrate, in the through hole;
   a through electrode formed in the through hole to extend to the second surface of the substrate and having a first end surface and a second end surface, wherein the first end surface of the through electrode is located on the second surface side of the elastic member, and the second end surface of the through electrode is exposed on a side of the second surface of the substrate;
   a trace formed to extend from the second surface of the elastic member to the first surface of the elastic member, wherein the trace is electrically connected to the through electrode on the second surface of the elastic member, the trace comprises a first trace and a second trace, one end portion of the first trace is in contact with the second surface of the elastic member and is electrically connected to the first end surface of the through electrode, the first trace extends along an inner surface of the through hole, the other end portion of the first trace is located on the first surface of the substrate, one end portion of the second trace is electrically connected to the other end portion of the first trace, and the other end portion of the second trace is located on the first surface of the elastic member; and
   a contact bump electrically connected to the other end portion of the second trace above the first surface of the elastic member, wherein the contact bump is electrically connected to an electrode pad formed on a DUT (device under test) when an electrical testing is performed on the DUT using the probe card.

2. The probe card of claim 1, wherein the second trace is formed on the first surface of the elastic member such that at least a portion of the first surface of the elastic member is exposed from the second trace.

3. The probe card of claim 1,
   wherein the through hole comprises:
   a first hole extending to the first surface of the substrate and formed such that a diameter of the first hole is gradually increased toward the first surface of the substrate,
   wherein the elastic member is formed in the first hole, and
   wherein the contact bump is electrically connected to the through electrode via the trace,
   wherein the first trace is formed to extend along a rim of the first hole from the one end portion of the first trace to the other end portion, of the first trace, and
   wherein the portion of the second trace on which the contact bump is disposed is the other end portion of the second trace.

4. The probe card of claim 3, wherein the through hole further comprises:
   a second hole communicating with the first hole and extending to the second surface of the substrate, wherein the through electrode is formed in the second hole.

5. The probe card of claim 1, further comprising:
   a multilayer wiring structure formed on the second surface of the substrate and comprising a plurality of wiring layers and a plurality of insulating layers, wherein the plurality of wiring layers are electrically connected to the through electrode.

6. The probe card of claim 5, wherein the probe card is provided between the DUT and a wiring substrate such that the multilayer wiring structure is electrically connected to the wiring substrate and the contact bump is electrically connected to the DUT.

7. The probe card according to claim 1, wherein
the through hole includes
a first hole extending to the first surface of the substrate and formed such that a diameter of the first hole is gradually increased toward the first surface of the substrate, and
a second hole extend to the second surface of the substrate, the second hole being generally cylindrical.

8. The probe card according to claim 7, wherein
the second hole communicates with the first hole, and
the through electrode is formed in the second hole.

9. The probe card according to claim 1, further comprising:
an insulating film that electrically insulates the through electrode from the substrate.

10. The probe card according to claim 9, wherein the insulating film extends on the first surface of the substrate, the inner surface of the through hole, and the second surface of the substrate.

\* \* \* \* \*